(12) United States Patent
Sheu et al.

(10) Patent No.: US 11,331,770 B2
(45) Date of Patent: May 17, 2022

(54) OMNI-DIRECTIONAL CONDITIONER DEVICE

(71) Applicant: National Tsing Hua University, Hsinchu (TW)

(72) Inventors: Dongliang Daniel Sheu, Hsinchu (TW); Yi-Hung Lin, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 667 days.

(21) Appl. No.: 16/281,730

(22) Filed: Feb. 21, 2019

(65) Prior Publication Data

US 2019/0366505 A1 Dec. 5, 2019

(30) Foreign Application Priority Data

May 31, 2018 (TW) .................................. 107118643

(51) Int. Cl.
*B24B 53/017* (2012.01)
*H01L 21/321* (2006.01)
*H01L 21/304* (2006.01)
*B24B 37/04* (2012.01)

(52) U.S. Cl.
CPC .......... *B24B 53/017* (2013.01); *B24B 37/042* (2013.01); *H01L 21/304* (2013.01); *H01L 21/3212* (2013.01)

(58) Field of Classification Search
CPC ....... B24B 53/017; B24B 53/02; B24B 53/12; B24B 37/042; B24B 37/013; B24B 37/27; B24B 37/30; B24B 37/32; B24B 37/10; B24B 37/105; B24B 37/107; B24B 49/10; B24B 49/16; B24B 49/18; B24B 49/186; H01L 21/304; H01L 21/3212
USPC ..... 451/443, 72, 56, 262, 269, 285, 286, 41, 451/5, 158, 398
See application file for complete search history.

(56) References Cited

U.S. PATENT DOCUMENTS

| 5,906,754 A | 5/1999 | Appel et al. | |
| 6,506,099 B1 * | 1/2003 | Bartlett | B24B 37/30 |
| | | | 451/285 |
| 6,929,536 B2 * | 8/2005 | Kuhn | B24B 53/017 |
| | | | 451/21 |
| 7,217,172 B2 * | 5/2007 | Benner | B24B 53/017 |
| | | | 451/11 |
| 2014/0273756 A1 * | 9/2014 | Chen | B24B 37/32 |
| | | | 451/28 |

* cited by examiner

*Primary Examiner* — Joel D Crandall
*Assistant Examiner* — Robert F Neibaur
(74) *Attorney, Agent, or Firm* — Birch, Stewart, Kolasch & Birch, LLP (57) ABSTRACT

An omni-directional conditioner device includes a carrier that includes a holding part for holding and rotating an object for polishing purpose; a conditioner disposed around the carrier; and a transmission mechanism connected with the carrier on one side and the conditioner on the other side, the transmission mechanism including at least one directional adjustment unit that controls the rotational direction of the conditioner. When the directional adjustment unit is set in one position, the carrier and the conditioner rotate in a same direction, and when the directional adjustment unit is set in another position, the carrier and the conditioner rotate in opposite directions.

11 Claims, 8 Drawing Sheets

OMNI-DIRECTIONAL CONDITIONER DEVICE

CROSS-REFERENCE TO RELATED APPLICATION

This application claims priority of Taiwanese Patent Application No. 107118643, filed on May 31, 2018.

FIELD

The disclosure relates to an omni-conditioner device that may be adapted to use for rotating an object such as a wafer in a polishing/finishing process.

BACKGROUND

Specific products (e.g., a wafer) are subjected to an abrasive polishing or a surface finishing process, such as a chemical mechanical polishing (CMP) process, so as to make the products flat or planar. As disclosed in U.S. Pat. No. 5,906,754, in a conventional CMP process, a rotating pad is provided to a carrier that is disposed over a first part of the rotating pad (not on the center of the rotating pad) to carry the product, to press the product on a pad surface of the rotating pad, and to rotate the product such that the product is flattened.

Additionally, a conditioner is disposed over a second part of the rotating pad, and is configured to perform a conditioning operation so as to remove particles that is left on the pad surface (e.g., material of the product that is removed from the product being pressed on the pad surface, a slurry that is applied on the pad surface for lubrication, etc).

It may be beneficial to perform the polishing process and the conditioning operation simultaneously with simplified mechanism. It is also beneficial to expel the particles in a direction away from the product, so as to avoid the potential scratches on the product, for any combinations of rotational directions for the polisher and the pad.

SUMMARY

One object of the disclosure is to provide an omni-directional conditioner device.

According to one embodiment of the disclosure, the omni-directional conditioner device is adapted for rotating an object, and includes:

a carrier that includes a holding part for holding the object, and a surrounding surface surrounding the holding part;

a conditioner that is disposed around the surrounding surface; and at least one directional adjustment unit that includes a transmission mechanism disposed between the carrier and the conditioner, and associated with the surrounding surface of the carrier and the conditioner, a directional adjustment unit that controls the rotational direction of said conditioner, one embodiment of the directional adjustment unit is a locking component for selectively engaging the transfer mechanism to control its rotational direction, wherein when the locking component is in a first position it drives the conditioner to rotate in the same direction as the carrier via the transmission mechanism. When the locking component in a second position, the transfer mechanism drives the conditioner in the opposite direction of the conditioner. In addition, with the same configuration of the carrier, the conditioner, the transfer mechanism, and the directional adjustment unit, the driving force can be either from the carrier or from the conditioner.

Another object of the disclosure is to provide a mechanical surface-finishing system that includes the above-mentioned omni-directional conditioner device. The mechanical surface-finishing system further includes a rotating table formed with a hole.

The omni-directional conditioner device is disposed on the rotating table and is adapted to rotate an object to perform a surface-finishing operation. The hole permits waste that is generated during the surface-finishing operation to be expelled therethrough.

BRIEF DESCRIPTION OF THE DRAWINGS

Other features and advantages of the disclosure will become apparent in the following detailed description of the embodiments with reference to the accompanying drawings, of which.

Part (A) of FIG. 4 is a fragmentary perspective view illustrating the directional adjustment unit of the omni-directional conditioner device, where the slidable engaging portion is in a non-engaging position.

Part (B) of FIG. 4 is another example of fragmentary perspective view illustrating a modification of the directional adjustment unit of the omni-directional conditioner device, where the slidable engaging portion is in a non-engaging position.

DETAILED DESCRIPTION

Figure 1:
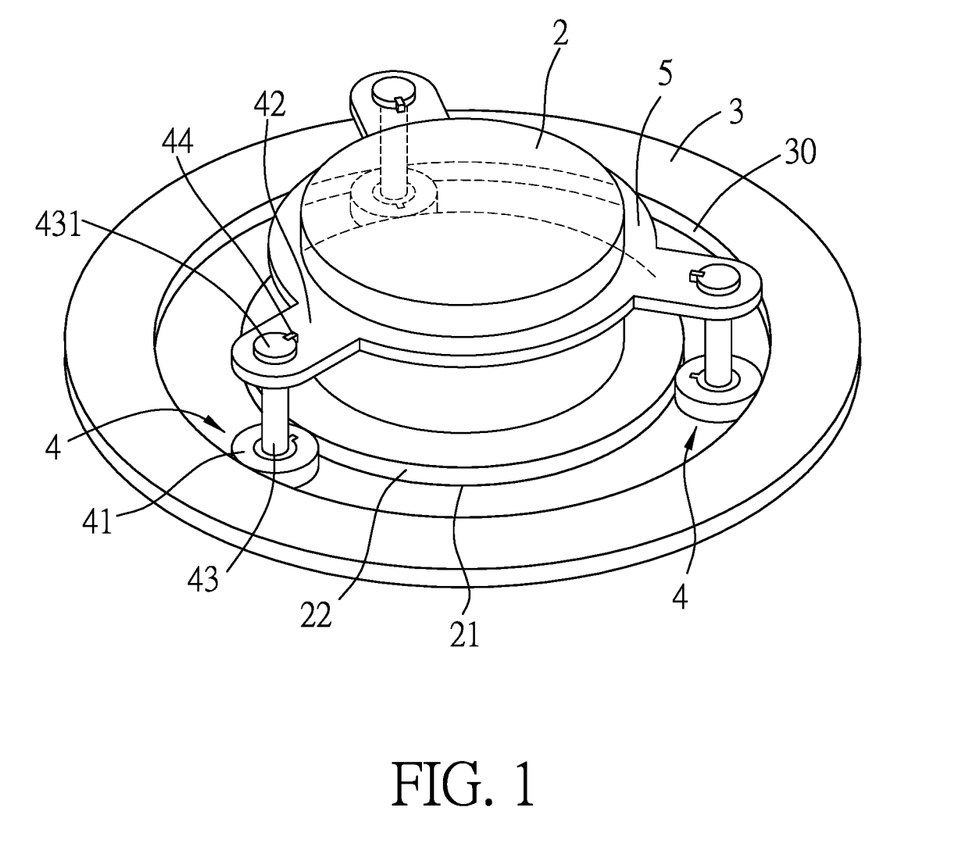
FIG. 1 is a perspective view illustrating an omni-directional conditioner device according to one embodiment of the disclosure.

FIG. 1 is a schematic view illustrating an omni-directional conditioner device according to one embodiment of the disclosure. The omni-directional conditioner device is adapted to the carrier which carries and polishes the object.

Figure 3:
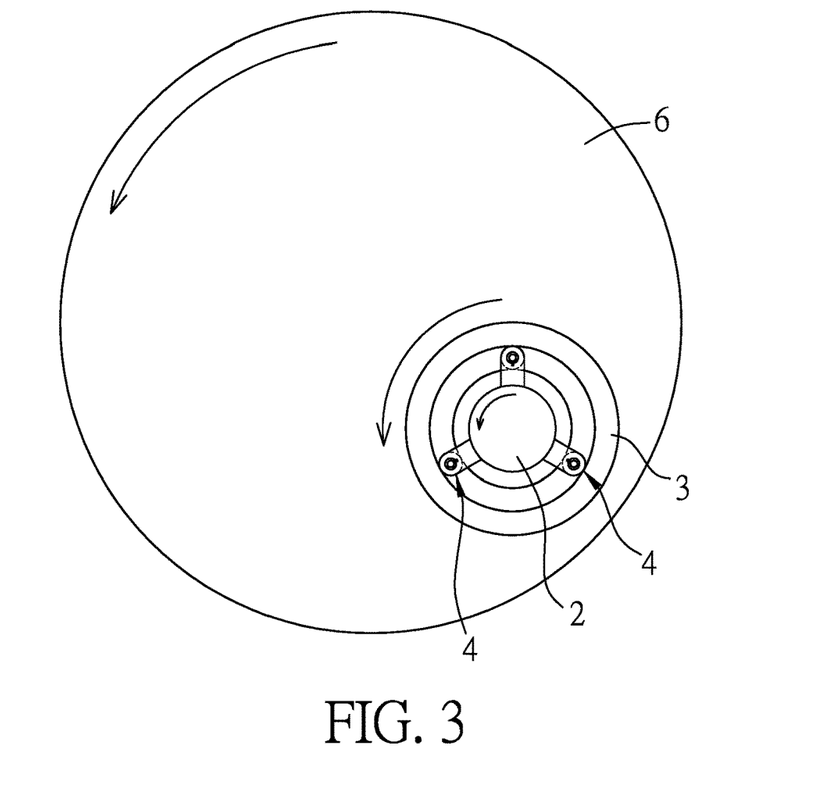
FIG. 3 is a schematic view illustrating operation of the omni-directional conditioner device of FIG. 1 included in a mechanical surface finishing system, where the slidable engaging portion is in the contact engaging position.

In this embodiment, the omni-directional conditioner device may be employed in a surface-finishing operation, such as chemical mechanical polishing (CMP) process. Specifically, as shown in FIG. 3, a rotating table 6 may be employed to operate with the omni-directional conditioner device to form a mechanical surface finishing system, and the object to be carried by the omni-directional conditioner device is a wafer.

In use, the omni-directional conditioner device is to be disposed over a pad surface of the rotating table 6, is connected to a support arm (not shown), and is driven by a driving mechanism (e.g., a motor, not shown) that is mounted to the support arm so as to rotate simultaneously with the rotating table 6. In this manner, the wafer, which is driven to rotate by the omni-directional conditioner device, is to be pressed onto the pad surface of the rotating table 6, and is flattened by the relative movements between the wafer and the rotating table 6. It is noted that during the CMP process, particles of waste resulting from the wafer being finished are generated.

The omni-directional conditioner device includes a carrier 2, a conditioner 3, and a transmission mechanism. In one embodiment, the transmission mechanism includes at least one directional adjustment unit 4. In some embodiments, the transmission mechanism of the omni-directional conditioner device further includes a mounting seat 5.

The carrier 2 includes a holding part 21 for holding the object, and a surrounding surface 22 surrounding the holding part 21. In this embodiment, the holding part 21 is circular-shaped. The carrier 2 may be connected to the driving unit that provides force needed for the carrier 2 to rotate. In other embodiments, the conditioner 3 may be connected to the driving unit.

The conditioner 3 is disposed around the surrounding surface 22, and has an inner surface 30 disposed to face the carrier 2. In this embodiment, the conditioner 3 is ring-shaped. When the conditioner 3 is being rotated, particles located below the conditioner 3 are expelled due to a centrifugal force provided by the rotation of the conditioner 3. The operation of the conditioner 3 may be referred to as a conditioning operation.

The transmission mechanism is configured to transmit the rotational energy from one of the carrier 2 and the conditioner 3 to the other.

Specifically, in this embodiment, the at least one directional adjustment unit 4 is disposed to associate the carrier 2 and the conditioner 3 with each other. In this embodiment, three directional adjustment units 4 are present.

In this embodiment, each of the directional adjustment units 4 includes a driving component 41, a connecting component 43, and a locking component 44. In some embodiments, each of the directional adjustment units 4 further includes a supporting component 42. The connecting component 43 and the locking component 44 may be referred to as a whole as a directional adjustment unit.

The driving component 41 is disposed between the carrier 2 and the conditioner 3, and is associated with the surrounding surface 22 of the carrier 2 and the inner surface 30 of the conditioner 3. In this embodiment, the driving component 41 is embodied using a pinion, and both the surrounding surface 22 of the carrier 2 and the inner surface 30 of the conditioner 3 is formed with teeth (not depicted in the drawings) to mesh with the driving component 41.

It is noted that in other embodiments, the driving component 41 and components connected to the driving component 41 may be embodied using other mechanisms and/or structures. Additionally, the directional adjustment unit may be embodied using other mechanisms and/or structures.

The connecting component 43 is co-rotatably connected to the driving component 41. The locking component 44 is for removably engaging the connecting component 43. That is to say, at least one of the locking component 44 and the connecting component 43 is operable to engage or to disengage from the other one of the locking component 44 and the connecting component 43.

The connecting component 43 and the locking component 44 are configured in a manner such that when the connecting component 43 engages the locking component 44, rotation of either one of the carrier 2 and the conditioner 3 in a first direction drives the other one of the carrier 2 and the conditioner 3 to rotate in the first direction via the driving component 41. On the other hand, when the connecting component 43 does not engage the locking component 44, rotation of either one of the carrier 2 and the conditioner 3 in the first direction drives the other one of the carrier 2 and the conditioner 3 to rotate in a second direction opposite to the first direction via the driving component 41.

In order to achieve the effect as described above, the mounting seat 5 may be employed. As shown in FIG. 1, the directional adjustment units 4 are mounted on the mounting seat 5, which is disposed to surround the carrier 2. Each of the carrier 2, the conditioner 3 and the mounting seat 5 is rotatably mounted to the support arm (directly or indirectly). Either one of the carrier 2 and the conditioner 3 may be coupled to and be driven by the driving mechanism.

When the connecting component 43 engages the locking component 44, the mounting seat 5, the carrier 2 and the conditioner 3 are co-rotatable with one another.

On the other hand, when the connecting component 43 does not engage the locking component 44, the carrier 2 and the conditioner 3 are configured to respectively rotate in two opposite directions relative to the mounting seat 5.

Figure 2:
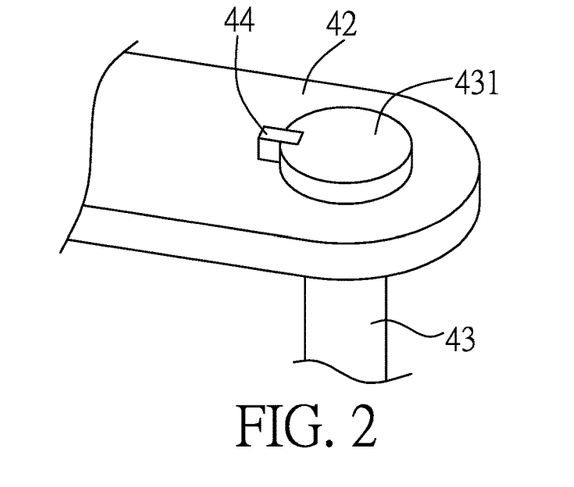
FIG. 2 is a fragmentary perspective view illustrating a directional adjustment unit of the omni-directional conditioner device, where a slidable engaging portion is in a contact engaging position.
Figure 4:
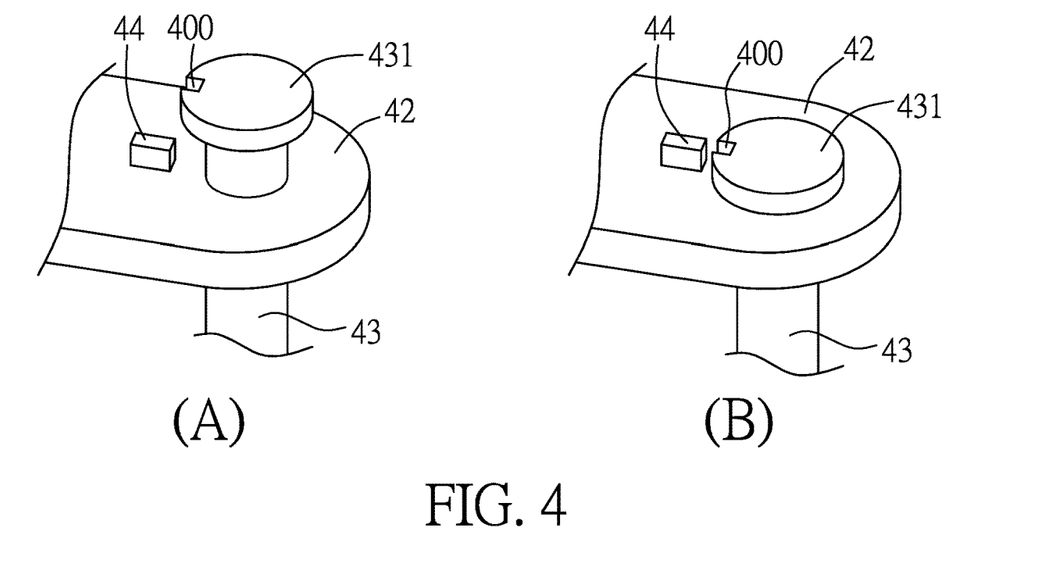

FIG. 2 and part (A) of FIG. 4 partially illustrate one of the directional adjustment units 4 used in the embodiment of FIG. 1.

In this embodiment, each of the directional adjustment units 4 further includes a supporting component 42 that is spaced apart from the driving component 41 and that is co-rotatably connected to the mounting seat 5. The connecting component 43 includes a slidable engaging portion 431 that is co-rotatable with the driving component 41 and that is slidable between a contact location (see FIG. 2), in which the slidable engaging portion 431 engages the locking component 44, and a non-engaging position (see part (A) of FIG. 4), in which the slidable engaging portion 431 does not engage the locking component 44. In this embodiment, the movement of the slidable engaging portion 431 may be manually driven, and may be controlled by a separate mechanism to move when needed.

The connecting component 43 is rotatably mounted to the supporting component 42. The engaging portion 431 is slidable relative to the supporting component 42. The locking component 44 is disposed on the supporting component 42.

Specifically, the engaging portion 431 may be embodied using slidable block having a recess 400 for engaging the locking component 44.

The operation of the omni-directional conditioner device when the connecting component 43 engages the locking component 44 (i.e., the slidable engaging portion 431 is in the contact location), is illustrated in FIG. 3.

Specifically, each of the rotating table 6 and the carrier 2 may be separately driven to rotate in a specific direction (e.g., counter-clockwise), and the mounting seat 5 is permitted to rotate relative to the support arm. Since the engaging portion 431 engages the locking component 44, rotational movements of the connecting component 43 relative to the supporting component 42 is prohibited, and each of the directional adjustment units 4 serves to drive rotation of the conditioner 3 in the specific direction (i.e., counter-clockwise) along with the carrier 2.

Figure 5:
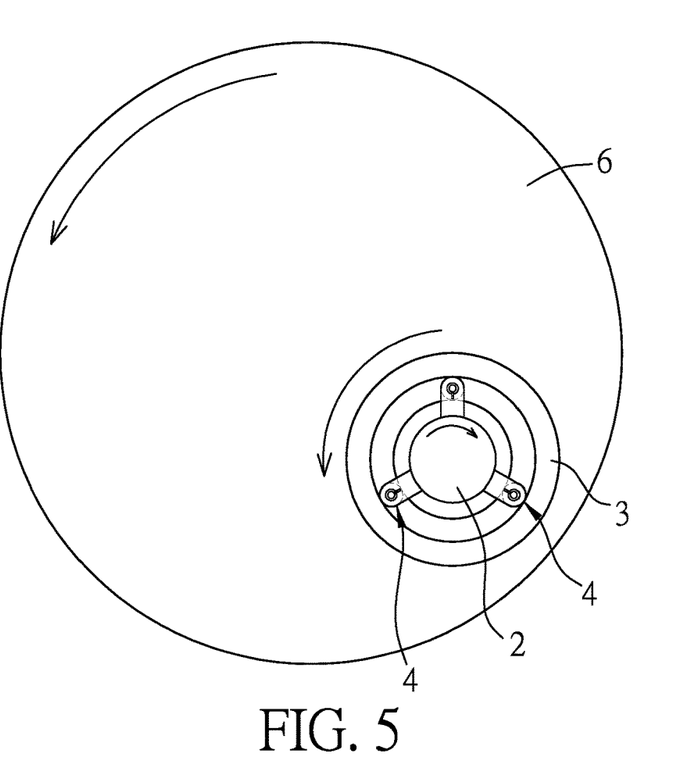
FIG. 5 is a schematic view illustrating operation of the omni-directional conditioner device of FIG. 1 included in the mechanical surface finishing system, where the slidable engaging portion is in the non-engaging position.

On the other hand, the operation of the omni-directional conditioner device when the connecting component 43 does not engage the locking component 44 (i.e., the slidable engaging portion 431 is in the non-engaging position), is illustrated in FIG. 5.

Specifically, when the rotating table 6 is driven to rotate in a specific direction (e.g., counter-clockwise), the carrier 2 is driven to rotate in an opposite direction (e.g., clockwise), and the mounting seat 5 is locked relative to the support arm (i.e., the mounting seat 5 is not rotatable relative to the support arm).

In this case, the components of the omni-directional conditioner device, that is, the carrier 2, the directional adjustment units 4 mounted on the mounting seat 5, and the conditioner 3 are configured to operate as a planetary gear. Of the planetary gear, the carrier 2 serves as a sun gear, the transmission components 41 serve as planet gears, the mounting seat 5 serves as a planet carrier, and the conditioner 3 serves as a ring gear.

By virtue of the characteristics of the planetary gear, when the sun gear is driven to rotate in a first direction and the planet gears are configured to rotate with the sun gear without orbiting movement, the ring gear is configured to rotate in a second direction that is opposite to the first direction.

As a result, in the example of FIG. 5, when the carrier 2 is driven to rotate in the clockwise direction, the conditioner 3 in turn is driven to rotate in the counter-clockwise direction.

Referring to part (B) of FIG. 4, a modification of the directional adjustment unit 4 is configured such that, the locking component 44 is movably mounted on the supporting component 42, and is operable to engage or disengage from the engaging portion 431 of the connecting component 43.

FIGS. 6 to 9 illustrate different possible cases when components of the mechanical surface finishing system are rotating in various directions during the surface-finishing operation on the object.

Specifically, as shown by the broken arrow, an expel direction (D) indicates, for each case, a direction in which the residues generated during the surface-finishing operation is expelled by the conditioner 3.

The term "frontal residue flow direction" can be defined as the residues carried by the rotating table 6 and coming to the conditioner 3. The term "rear residues" refers to residues that are carried away from the polishing area of the rotating table 6, and that are of little concern regarding the surface scratch on the surface of the object/product. The flow direction of the rear residues are, in general, opposite to the counterpart frontal residues.

As a result, the removal of front residue by the conditioner 3 needs to be addressed. Regardless of the carrier rotational direction, situations of the frontal residue flow direction affected by the pad and conditioner rotational directions are summarized in the following Table 1.

TABLE 1

Figure 6:
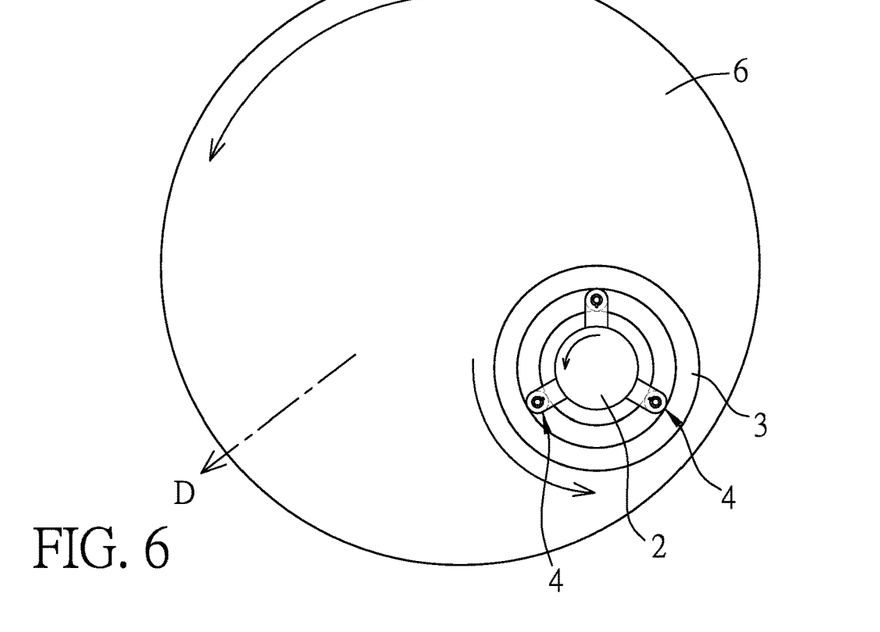
FIGS. 6 to 9 illustrate different possible cases when components of the mechanical surface finishing system are rotating in various directions during a surface-finishing operation on an object, the dashed line showing approximate direction of residue flow direction.
Figure 7:
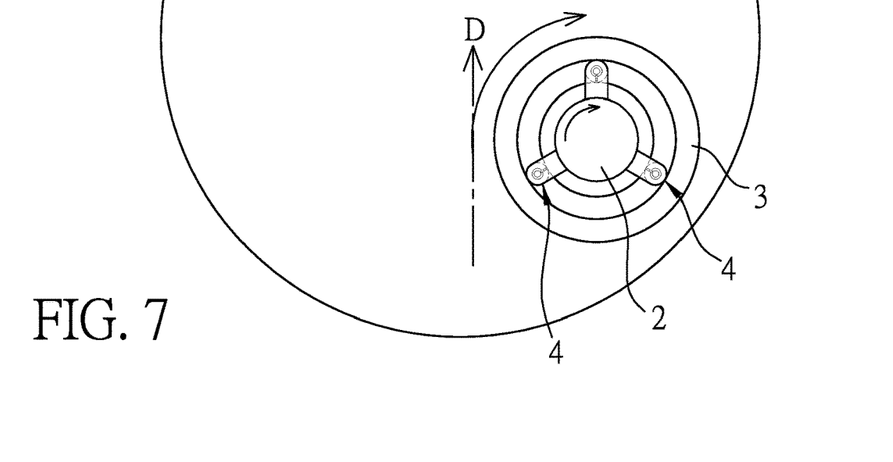
Figure 8:
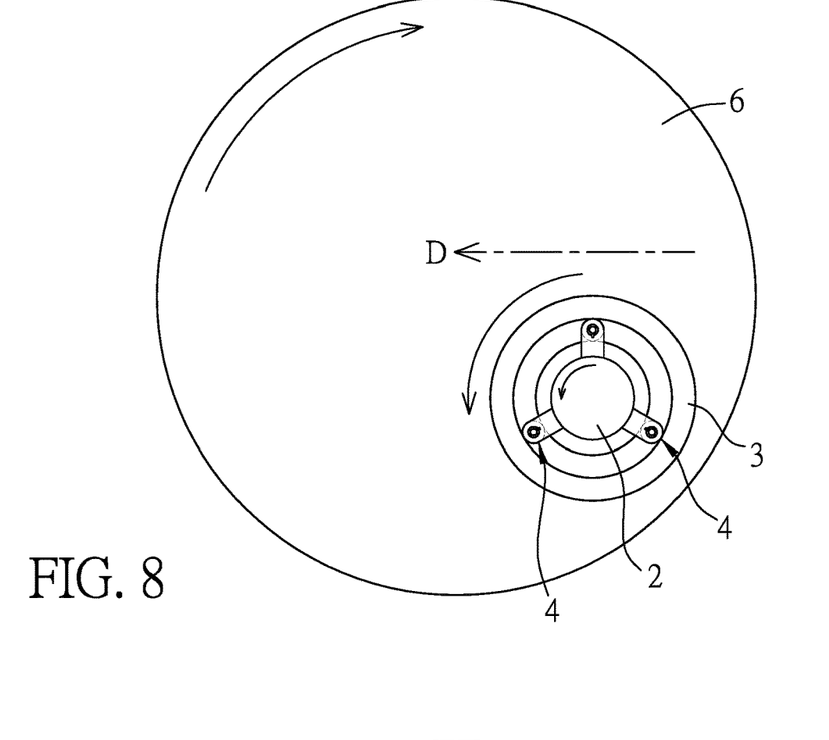
Figure 9:
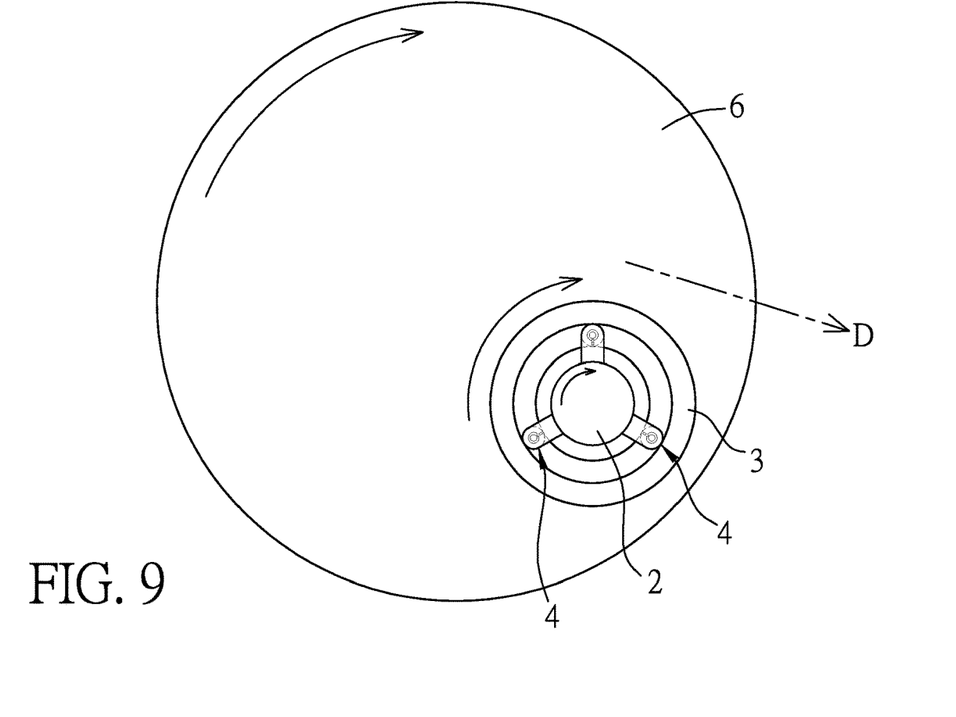

| Pad direction | Conditioner direction | Front Residue direction | Remarks |
|---|---|---|---|
| Ccw | ccw | outward | FIG. 6 |
| Ccw | cw | inward | FIG. 7 |
| Cw | ccw | inward | FIG. 8 |
| Cw | cw | outward | FIG. 9 |

Note:
"ccw" means "counter clockwise",
"cw" means "clockwise"

Referring to Table 1, with sufficient rotation of the conditioner 3, as long as the rotational directions of the rotating table 6 and the conditioner 3 are the same, the direction of the frontal residue flow, which is outward, will be effective for removing the residues from the product (see FIGS. 6 and 9). If the rotational directions of the rotating table 6 and the carrier 6 are opposite to each other, even though many of the rear residues may have been expelled outward to be removed from the rotating table 6, it may be beneficial to have a hole or channel in the central part of the rotating table 6 to allow the remaining inward frontal resides to be expelled from the system. This will ensure that the residues are expelled away from the product surface.

Figure 10:
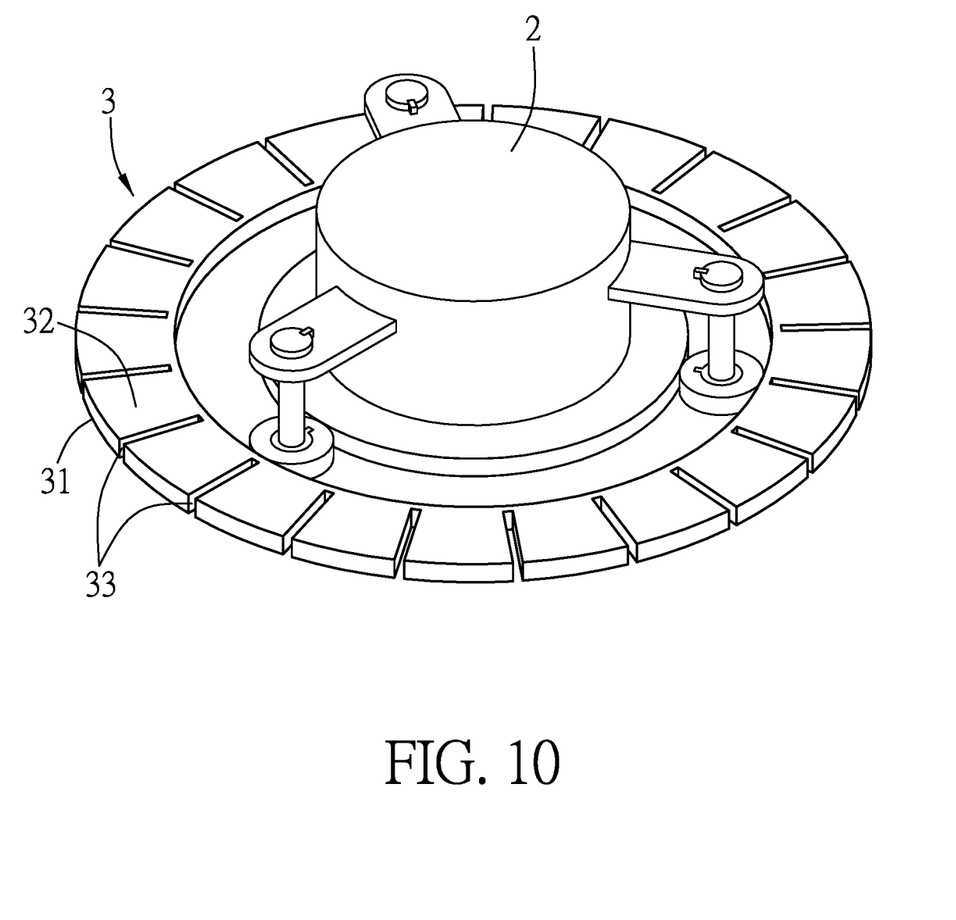
FIG. 10 is a perspective view illustrating an omni-directional conditioner device according to one embodiment of the disclosure.

FIG. 10 is a perspective view illustrating an omni-directional conditioner device according to one embodiment of the disclosure.

In this embodiment, the conditioner 3 has a base surface 31, atop surface 32 opposite to the base surface 31, and a plurality of grooves 33.

Each of the grooves 33 is formed through the base surface 31 and the top surface 32, and extends radially in a linear or a non-linear fashion.

One advantage of the omni-directional conditioner device in this embodiment is that, by introducing the grooves 33 on the conditioner 3, the waste generated during the surface-finishing operation may be expelled by the conditioner 3 more efficiently, since the grooves 33 provide better channels for the wastes to be removed more effectively. The shapes of these radially placed grooves 33 can also be optimized for better effectiveness.

It is noted that the centrifugal forces acting upon the wastes in the grooves of the rotating omni-directional conditioner device can also contribute to the removal of the wastes away from the carrier 2.

Figure 11:
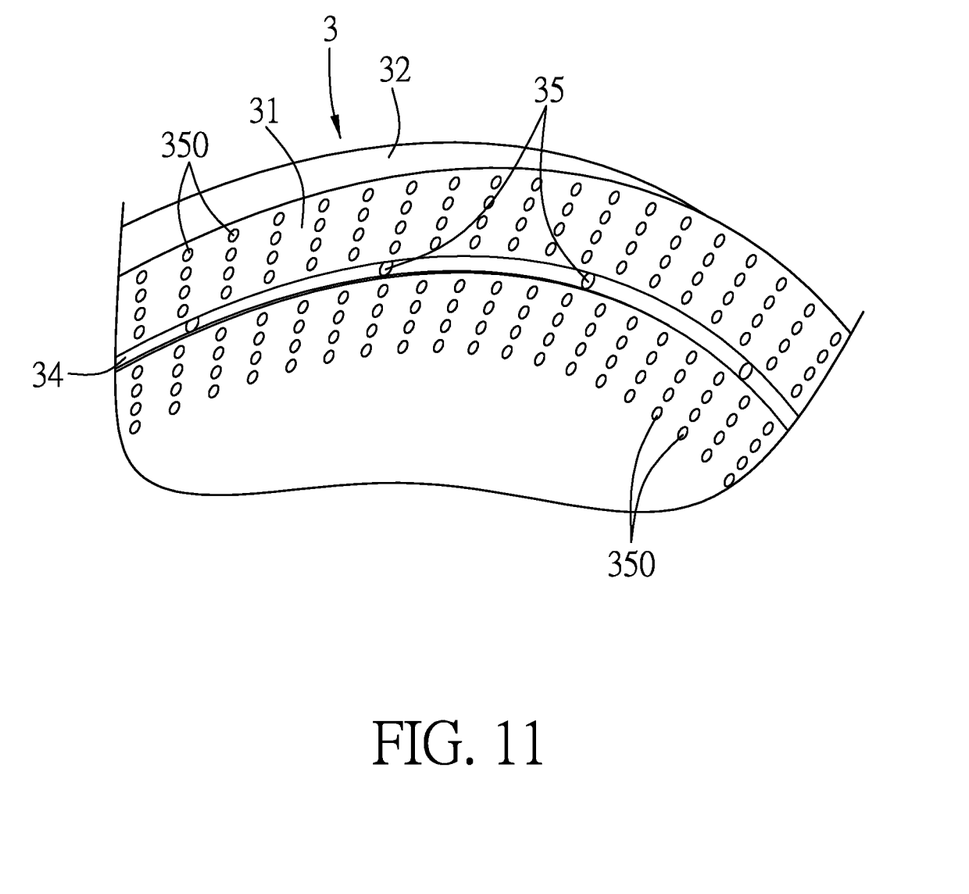
FIG. 11 is a fragmentary perspective view illustrating a part of a conditioner of an omni-directional conditioner device according to one embodiment of the disclosure.

FIG. 11 is a fragmentary bottom perspective view illustrating a part of a conditioner 3 of an omni-directional conditioner device according to one embodiment of the disclosure.

In this embodiment, the conditioner 3 has a base surface 31 that faces a direction toward the rotating table 6, the same direction as that of the holding part 21 faces (with reference to FIG. 1 or 10), a top surface 32 that is opposite to the base surface 31, a surrounding groove 34, different from the radial grooves 33 mentioned previously, that is formed in the base surface 31 and that is disposed for surrounding the holding part 21, and a plurality of through holes 35.

Each of the through holes 35 is formed through the top surface 32 and a groove-defining surface that defines the surrounding groove 34.

It is noted that in this embodiment, the structures of other components of the omni-directional conditioner device are the same with the embodiment of FIG. 1, and details thereof are omitted herein for the sake of brevity.

There are two distinct ways of using these holes and channels: 1) It is possible to employ a suction force disposed over the top surface 32. The suction force is capable of creating a vacuum in the through holes 35, so as to remove the waste from the omni-directional conditioner device; 2) Pressurized liquid or gas, such as water or air can be injected from above the top surface 32 through the through holes 35 in directions conducive to expel the residue more effectively to better condition the rotating pad on the rotating table 6. It is also possible to inject cleaning plasma through the holes or groves to react with the residues making it easier to remove from the system.

In some embodiments, the base surface 31 may be formed or attached with some small hard elements 350. The elements 350 may be made of scrubbing or rubbing elements such as diamond or other pad cleaning materials to enhance residue removal from the rotating table 6.

Figure 12:
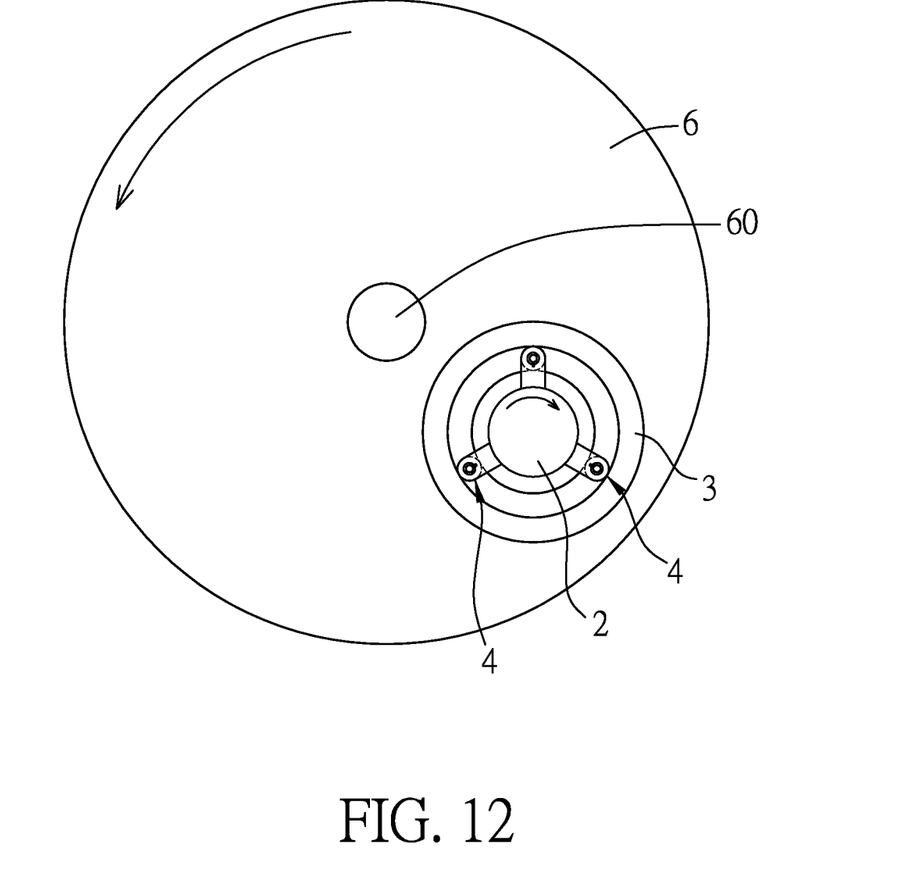
FIG. 12 is a schematic view of a mechanical surface finishing system according to one embodiment of the disclosure.

FIG. 12 is a schematic view of a mechanical surface finishing system according to one embodiment of the disclosure.

In this embodiment, the rotating table 6 is formed with a hole 60, and the omni-directional conditioner device is one as described in the embodiment of FIG. 1.

In this embodiment, the omni-directional conditioner device is disposed on the rotating table 6, and is adapted to rotate an object to perform a surface-finishing operation. The hole 60 permits waste that is generated during the surface-finishing operation to be expelled therethrough for the case when the frontal residue flowing direction is inward as indicated in Table 1.

Notice that the rotation driving force of this disclosure can originate from the carrier 2 and be provided to the conditioner 3 or originate from the conditioner 3 and be provided to the carrier 2 depending on which one is connected to the driving unit. This disclosure covers both of the situations.

To sum up, embodiments of the disclosure provides a mechanical surface finishing system, which includes an omni-directional conditioner device. By connecting the carrier 2 and the conditioner 3 of the omni-directional conditioner device and to configure the carrier 2 and the conditioner 3 to be capable of rotating in any combinations of rotational directions with easy lock switch (i.e., the directional adjustment unit can be easily switched between positions), and the conditioning and polishing operations may be done simultaneously and efficiently without having to use separate driving mechanisms to control each of the carrier 2 and the conditioner 3.

In some embodiments, the conditioner 3 and/or may be formed with various structures to enhance the efficiency of the conditioning operation, such that waste generated during the surface-finishing operation may be expelled away from the carrier 2.

The following Table 2 lists the elements that have been recited in the disclosure and the corresponding reference numerals.

TABLE 2

| Element | Reference Numeral |
| --- | --- |
| Carrier | 2 |
| Holding Part | 21 |
| Surrounding Surface | 22 |
| Conditioner | 3 |
| Inner Surface | 30 |
| Base Surface | 31 |
| Top Surface | 32 |
| Groove | 33 |
| Surrounding Groove | 34 |
| Through Hole | 35 |

TABLE 2-continued

| Element | Reference Numeral |
| --- | --- |
| Hard Element | 350 |
| Directional Adjustment Unit | 4 |
| Recess | 400 |
| Driving Component | 41 |
| Supporting Component | 42 |
| Connecting Component | 43 |
| Slidable engaging portion | 431 |
| Locking Component | 44 |
| Mounting Seat | 5 |
| Rotating Table | 6 |
| Hole | 60 |

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An omni-directional conditioner device adapted for polishing an object, comprising:
    a carrier that includes a holding part for holding and rotating the object for polishing purpose;
    a conditioner disposed around said carrier wherein said carrier or said conditioner is connected to a driver which drives said carrier and said conditioner; and
    a transmission mechanism connected with said carrier on one side and said conditioner on the other side, said transmission mechanism including at least one directional adjustment unit that controls the rotational direction of said conditioner,
    wherein said directional adjustment unit is configured such that, when said directional adjustment unit is set in one position, said carrier and said conditioner rotate in a same direction, and when said directional adjustment unit is set in another position, said carrier and said conditioner rotate in opposite directions.

2. The omni-directional conditioner device of claim 1, wherein said transmission mechanism includes a gear and a pinion.

3. The omni-directional conditioner device of claim 1, wherein said directional adjustment unit includes a slidable block.

4. The omni-directional conditioner device of claim 1, wherein said conditioner has a base surface, a top surface opposite to said base surface, and a plurality of grooves each of which is formed through said base surface and said top surface and extends radially in either linear or non-linear fashion.

5. The omni-directional conditioner device of claim 1, wherein:
said conditioner has a base surface that faces a direction that is the same as a polishing side of said holding part, a top surface that is opposite to said base surface, and a plurality of through holes each of which is formed through said top surface and said base surface.

6. The omni-directional conditioner device of claim 1, wherein:
said conditioner has a base surface that faces a direction that is in the same direction as a polishing side of the holding part, wherein said base surface is provided with scrubbing or rubbing materials to enhance residue removal.

7. A mechanical surface-finishing system comprising:
a rotating table; and
an omni-directional conditioner device as claimed in claim 1, disposed on said rotating table and adapted to rotate an object to perform a surface-finishing operation.

8. The mechanical surface-finishing system of claim 7, wherein said rotating table has a hole permitting waste that is generated during the surface-finishing operation to be expelled therethrough.

9. The mechanical surface-finishing system of claim 7, wherein, said conditioner is formed with a plurality of grooves for allowing fluid, plasma or vacuum to be applied therethrough.

10. The mechanical surface-finishing system of claim 7, wherein said conditioner is formed with a plurality of through holes for allowing fluid, plasma or vacuum to be applied therethrough.

11. An omni-directional conditioner device adapted for polishing an object, comprising:
a carrier configured for holding and rotating the object;
a conditioner disposed around said carrier wherein said carrier or said conditioner is connected to a driver which drives said carrier and said conditioner; and
a transmission mechanism connected with said carrier on one side and said conditioner on the other side, said transmission mechanism including at least one directional adjustment unit that controls the rotational direction of said conditioner,
wherein said directional adjustment unit is configured such that, when said directional adjustment unit is set in one position, said carrier and said conditioner rotate in a same direction, and when said direction adjustment unit is set in another position, said carrier and said conditioner rotate in opposite directions.

\* \* \* \* \*